United States Patent
Hsu et al.

(10) Patent No.: US 6,693,821 B2
(45) Date of Patent: Feb. 17, 2004

(54) LOW CROSS-TALK ELECTRICALLY PROGRAMMABLE RESISTANCE CROSS POINT MEMORY

(75) Inventors: Sheng Teng Hsu, Camas, WA (US); Wei-Wei Zhuang, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/893,830

(22) Filed: Jun. 28, 2001

(65) Prior Publication Data

US 2003/0001178 A1 Jan. 2, 2003

(51) Int. Cl.$^7$ .............................................. G11C 11/00
(52) U.S. Cl. ....................................................... 365/158
(58) Field of Search ................................ 257/295, 296; 365/157, 158, 171, 173

(56) References Cited

U.S. PATENT DOCUMENTS

| | | | |
|---|---|---|---|
| 3,838,405 A | * | 9/1974 | Arnett et al. |
| 5,410,504 A | * | 4/1995 | Ward |
| 5,640,343 A | * | 6/1997 | Gallagher et al. |
| 5,712,612 A | * | 1/1998 | Lee et al. |
| 5,792,569 A | * | 8/1998 | Sun et al. |
| 5,991,193 A | * | 11/1999 | Gallagher et al. |
| 6,128,214 A | | 10/2000 | Kuekes et al. ............... 365/151 |
| 6,198,208 B1 | * | 3/2001 | Yano et al. |
| 6,204,139 B1 | * | 3/2001 | Liu et al. |
| 6,479,848 B2 | * | 11/2002 | Park et al. |

OTHER PUBLICATIONS

Wu et al., "High Temperature Retention Properties of Ferroelectric PZT/YBCO Heterostructures Investigated by Pyroelectric Current and Phase Detection," 1996, Proceedings of the Tenth IEEE International Symposium on Applications of Feroelectrics, p. 507–510.*

Article entitled, "Electric-pulse-induced reversible resistance change effect in magnetoresistive films", by S. Q. Liu et al., published in Applied Physics Letters, vol. 76, No. 19, May 8, 2000, pp 2749–2751.

Article entitled, "Reproducible Switching Effect in Thin Oxide Films for Memory Applications", by A. Beck et al., published in Applied Physics Letters, vol. 77, No. 1, Jul. 3, 2000, pp. 139–141.

* cited by examiner

Primary Examiner—Nathan J. Flynn
Assistant Examiner—Kevin Quinto
(74) Attorney, Agent, or Firm—Matthew D. Rabdau; David C. Ripma; Scott C. Krieger

(57) ABSTRACT

Low cross talk resistive cross point memory devices are provided, along with methods of manufacture and use. The memory device comprises a bit formed using a perovskite material interposed at a cross point of an upper electrode and lower electrode. Each bit has a resistivity that can change through a range of values in response to application of one, or more, voltage pulses. Voltage pulses may be used to increase the resistivity of the bit, decrease the resistivity of the bit, or determine the resistivity of the bit. Memory circuits are provided to aid in the programming and read out of the bit region.

8 Claims, 3 Drawing Sheets

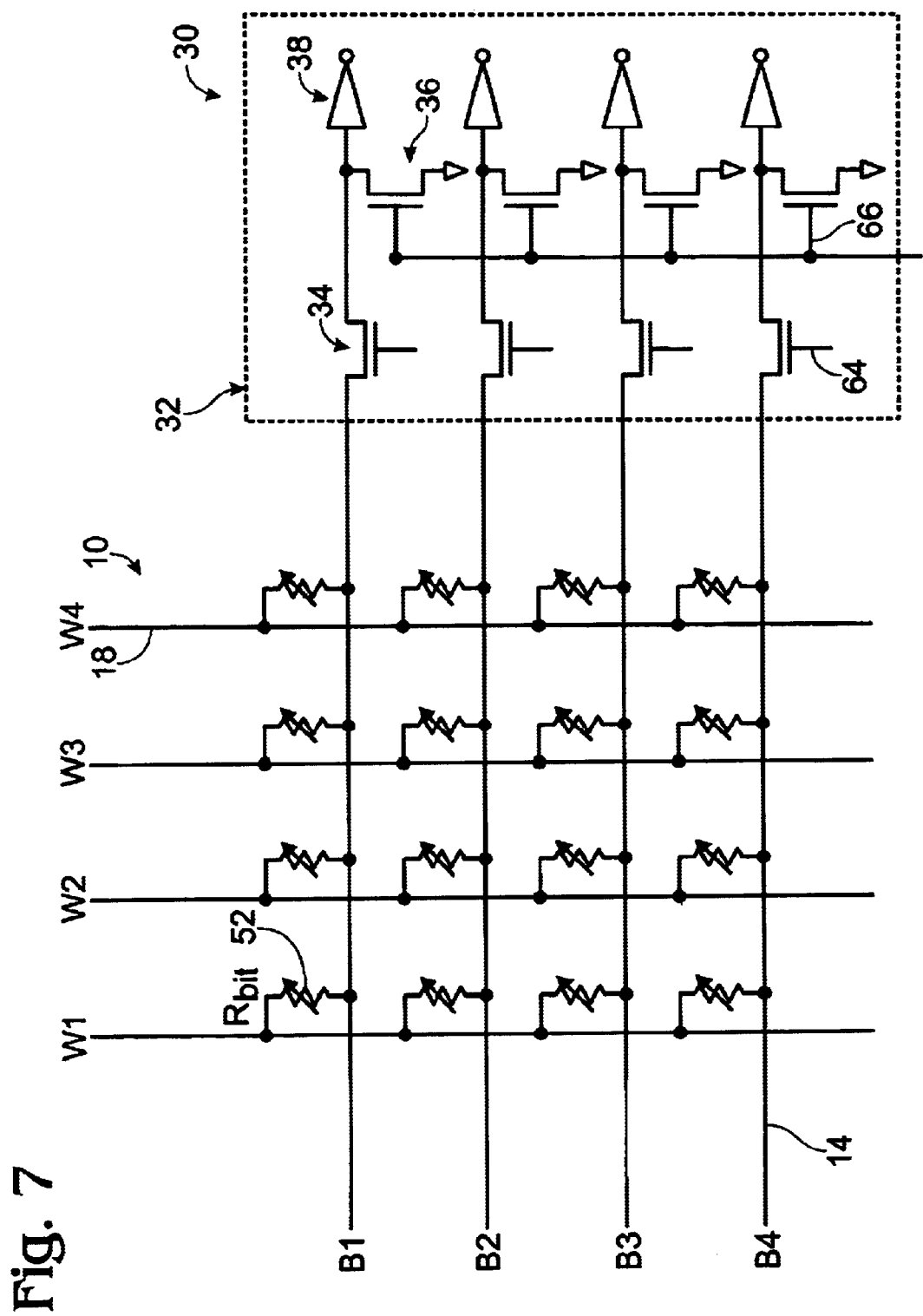

LOW CROSS-TALK ELECTRICALLY PROGRAMMABLE RESISTANCE CROSS POINT MEMORY

BACKGROUND OF THE INVENTION

This invention relates to nonvolatile memory, and more particularly to a cross point structure utilizing electric pulse induced resistance change effects in magnetoresistive films.

Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity from those used to induce the initial change.

SUMMARY OF THE INVENTION

Accordingly, a memory structure is provided, which comprises a substrate, a plurality of bottom electrodes overlying the substrate, a plurality of top electrodes overlying the bottom electrodes forming a cross point memory structure. A perovskite material located at each cross point interposed between a top electrode and a bottom electrode, wherein the perovskite material acts as a bit. Each bit may act as a variable resistor within a memory circuit.

A low cross talk memory structure is formed by depositing and patterning a conductive material over a substrate to form at least one bottom electrode. A layer of insulating material, such as silicon dioxide, is deposited over the substrate and the at least one bottom electrode. At least one contact opening is etched through the insulating material to the underlying bottom electrode. A layer of perovskite material is deposited over the bottom electrode and the insulating material. The perovskite material is polished off of the surface of the insulating material so that perovskite material remains in the contact opening. At least one top electrode is formed such that it crosses over the bottom electrode at the position of the perovskite material forming a cross point.

A memory circuit may be formed on the substrate prior to formation of the memory structure. The memory circuit assists with the programming and read out of the memory structure. Forming the memory circuit prior to the memory structure reduces damage to the perovskite material due to additional subsequent processing following formation of the memory structure.

BRIEF DESCRIPTION OF THE DRAWINGS

FIG. 7 is a schematic view of a cross point memory device with readout circuit.

DETAILED DESCRIPTION OF THE INVENTION

Figure 1:
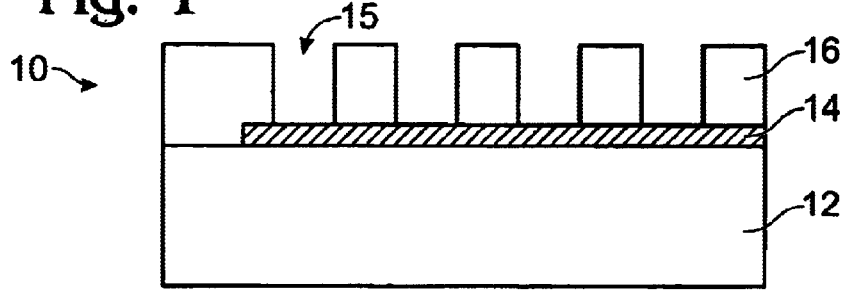
FIG. 1 is a cross-sectional view of a cross point memory structure during fabrication.

A method for forming a low cross talk resistive memory array is provided. FIG. 1 shows a cross-sectional view of a cross point memory array area 10 following some initial processing. The memory array area 10 comprises a substrate 12 with a bottom electrode 14 formed thereon. A layer of oxide 16, which is between approximately 300 nm and 800 nm, is deposited over the substrate, planarized and etched to form openings 15 to allow access to the bottom electrode. The thickness of the oxide over the bottom electrode is 50 nm to 600 nm depending on the material and the resistance desired.

The substrate 12 is any suitable substrate material, whether amorphous, polycrystalline or crystalline, such as $LaAlO_3$, Si, TiN or other material.

The bottom electrodes 14 are made of conductive oxide or other conductive material. In a preferred embodiment, the conductive material is a material, such as $YBa_2Cu_3O_7$ (YBCO), that allows the epitaxial growth of an overlying perovskite material. In another preferred embodiment, the conductive material is platinum. The bottom electrodes are a thickness in the range of between about 5 nm and about 500 nm. As shown, the bottom electrodes are deposited and patterned without first forming a trench and without polishing.

Figure 2:
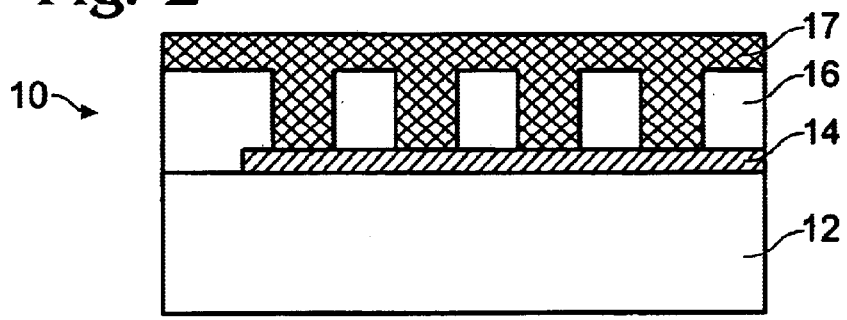
FIG. 2 is a cross-sectional view of a cross point memory structure during fabrication.

Referring now to FIG. 2, a layer of perovskite material 17 is deposited over the oxide 16 to fill the openings 15. The perovskite material 17 is a material capable of having its resistivity changed in response to an electrical signal. The perovskite material is preferably a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The perovskite material is preferably between about 50 nm and 500 nm thick. The perovskite material 17 can be deposited using any suitable deposition technique including pulsed laser deposition, rf-sputtering, e-beam evaporation, thermal evaporation, metal organic deposition, sol gel deposition, and metal organic chemical vapor deposition.

Figure 3:
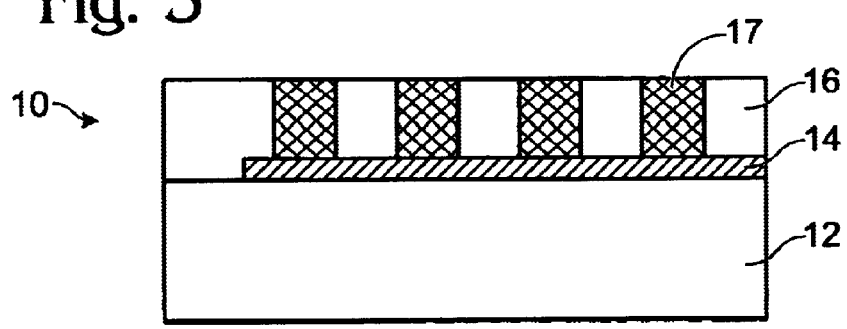
FIG. 3 is a cross-sectional view of a cross point memory structure during fabrication.

FIG. 3 shows the memory array area 10 following polishing of the perovskite material 17. The perovskite material is preferably polished using CMP.

Figure 4:
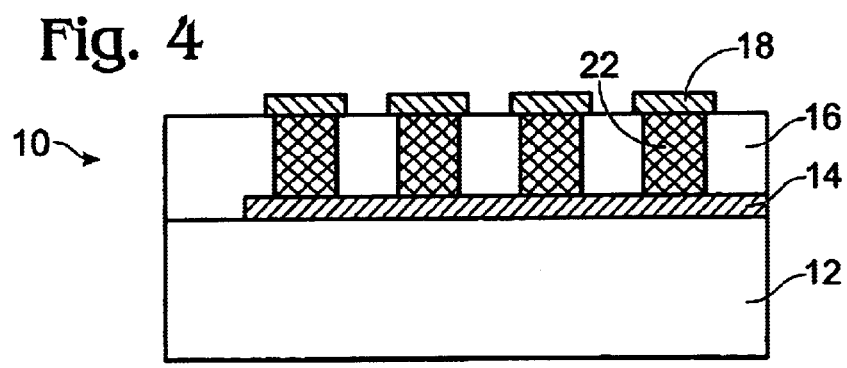
FIG. 4 is a cross-sectional view of a cross point memory structure during fabrication.

FIG. 4 shows the memory array area 10 following deposition and patterning of top electrodes 18. The top electrodes 18 comprise a conductive material, preferably platinum, copper, silver, or gold. The perovskite material that is now interposed between the bottom electrode 14 and one of the top electrodes 18 is now a resistive memory bit 22.

Figure 5:
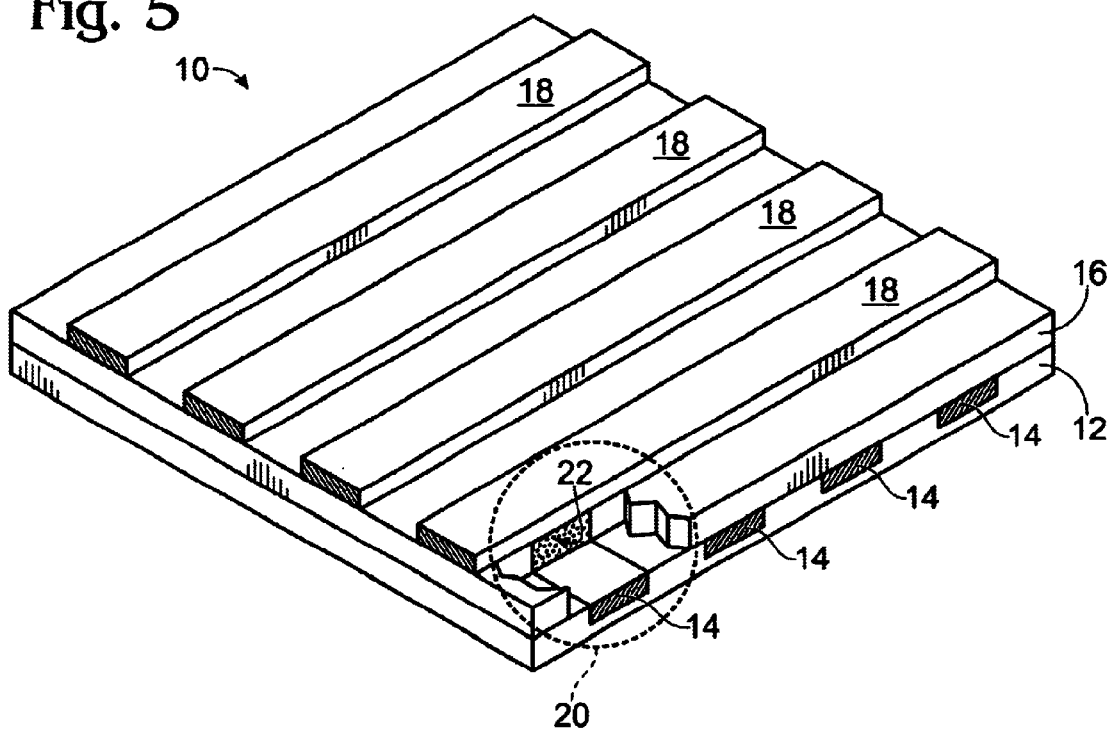
FIG. 5 is an isometric view of a cross point memory array area.

FIG. 5 shows the cross point memory array area 10. The memory array area 10 comprises the substrate 12 with a plurality of bottom electrodes 14 formed thereon. To illustrate another embodiment, the bottom electrodes 14 are formed by forming a trench, depositing the conductive material and polishing the conductive material until level with the substrate. The polishing can be accomplished using chemical mechanical polishing (CMP) or other suitable means. An oxide layer 16 has been deposited overlying the plurality of bottom electrodes 14. A plurality of top electrodes 18 overly the oxide layer 16, and the perovskite material 17 such that each memory bits 22 is interposed between the bottom electrodes 14 and the top electrodes 18.

A transparent region 20 (shown by a dashed circle) is used here to show the region as transparent for illustration purposes only, the material itself may or may not be transparent. Each bit region corresponds to a cross point. The oxide 16 is contiguous with the bit 22. The oxide acts as an isolation material to reduce, or eliminate, cross talk between bits. Although, for ease of explanation oxide is referred to, it would also be possible to use other suitable insultating materials instead. The bit 22 acts as a variable resistor that can be changed between at least two resistivity values. Changes to the resistivity of the bit 22 are preferably reversible. The reversibility of the resistivity change may incorporate some hysteresis. For some applications, such as write once read many (WORM) the resistivity change need not be reversible at all.

For example, if the bit 22 has a cross sectional area of one micrometer by one micrometer and YBCO is used to form the bit 22 with a thickness of 60 nm, the high resistance state is approximately 170 M$\Omega$ and the low resistance state is approximately 10 M$\Omega$. For a low voltage memory device, if the bit 22 is biased to 1 volt, the current through the bit will be approximately 6 nA for the high resistance state and approximately 100 nA for the low resistance state. This example has been provided for illustration purposes only. The resistance values will change depending upon the thickness, the material, and the cross sectional area of the bit. The voltage applied across the bit will further affect the current through the bit.

The top electrodes 18 and the bottom electrodes 14 are each preferably substantially parallel rows. The top electrodes 18 and the bottom electrodes 14 are arranged in a cross point arrangement such that they cross each other in a regular pattern. A cross point refers to each position where a top electrode crosses a bottom electrode. As shown, the top electrodes and the bottom electrodes are arranged at substantially 90 degrees with respect to each other. The top electrodes and the bottom electrodes can each function as either word lines or bit lines as part of a cross point memory array.

FIG. 5 shows just the memory array area. It should be clear that in an actual device, the substrate 12, the bottom electrodes 14 and the top electrodes 18 may extend well beyond the memory array area to other areas containing other device structures.

Figure 6:
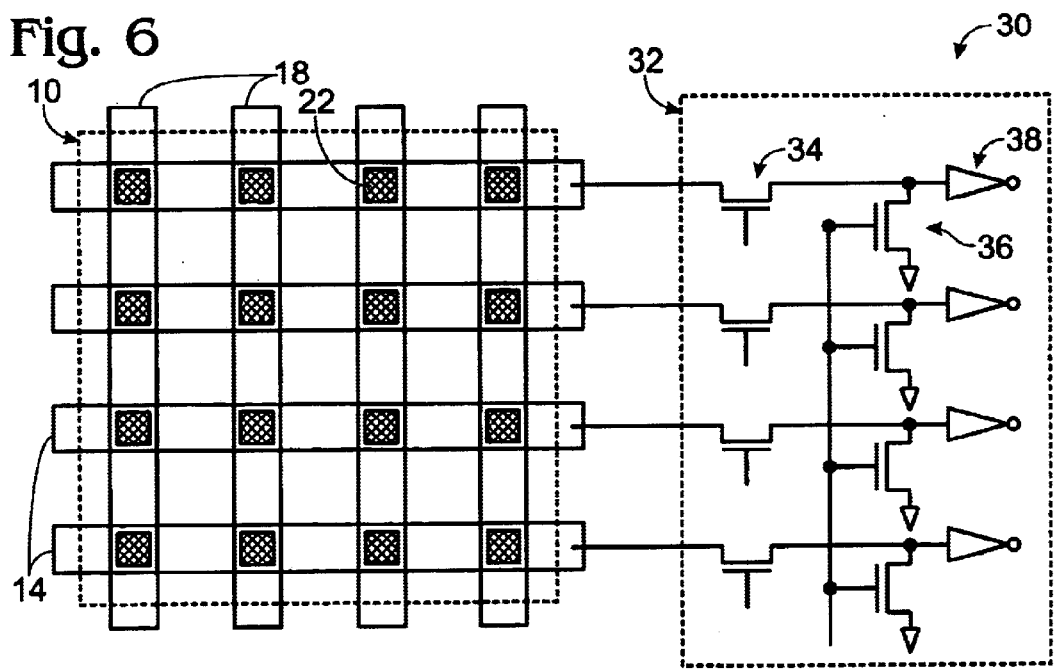
FIG. 6 is a schematic view of a memory readout circuit connected to a cross point memory array area.

Referring now to FIG. 6, a memory device 30 comprising the memory array area 10 connected to a memory circuit 32 is shown. The memory circuit 32 comprises at least one bit pass transistor 34 connected to at least one load transistor 36 and at least one inverter 38. These structures are shown schematically, as the formation of the individual semiconductor elements are well known.

In a preferred embodiment of a method of making the memory device 30, one, or more, of transistor structures, interconnects or other components of the memory circuit 32 may be formed prior to the formation of the memory array area 10. By forming components of the memory circuit 32 prior to the memory array area 10, possible degradation of the perovskite material due to subsequent processing is reduced, or eliminated.

FIG. 7 shows a schematic diagram of a 16 bit, 4×4-memory array, memory block 30. The memory block 30 comprises the memory array area 10 connected to the memory circuit 32. In this schematic view the each bit is shown as being a bit resistor 52 connected between the lower electrodes 14, which are also designated as bit lines B1 through B4, and the upper electrodes 18, which are also designated as word lines W1 through W4. Alternatively, the lower electrodes could be the word lines and the upper electrodes could be the bit lines. The bit lines are connected to the memory circuit 32. As shown, the lower electrodes are bit lines, so the lower electrodes are connected to the memory circuit 32.

The bit resistor 52 has a resistance that can be changed between at least two values, including a high resistance state and a low resistance state, in response to an electrical signal.

Referring now to the memory circuit 32, each bit line is connected to the bit pass transistor 34. The bit pass transistor 34 has a bit pass gate 64. The bit pass gate 64 contributes to determining which bit is being programmed or read out. The bit pass transistor is connected to the load transistor 36, which has a load gate 66, and the inverter 38. The load transistor is used to determine which memory block is being programmed or read out. The inverter is used in combination with the load transistor to set the output between two voltage levels, so that a binary state can be read out.

Once a device is completed and in operation, it can be programmed and read. It may also be desirable to set all of the bit resistors 52, especially those along a single word line, to the same resistance level either high resistance or low resistance. This may be used to produce a word erase or a block erase. For example, if n-channel transistors are used for the pass transistor and the load transistor, applying a negative voltage, or a plurality of negative voltage pulses, to a word line (e.g. W1) and grounding the bit pass gate 64 and the load transistor gate 66 of the memory block 30, sets all bit resistors 52 at the cross point of the word line to the same resistance state, either high resistance or low resistance. It would also be possible to use positive voltages at the word line, provided the bit pass gate and the load gate are properly biased to allow current to flow through the bit.

In another embodiment, p-channel transistors may be used for the bit pass transistor and the load transistor. In which case a positive voltage could be applied to the word line while grounding the bit pass gate and the load gate. A negative voltage pulse may be used provided that a sufficiently negative voltage is applied to the bit pass gate and the load gate to allow current to flow through the bit.

The applied voltage, or the plurality of voltage pulses, is preferably at a level that will not damage the perovskite material. Preferably, all bit resistors 52 at the cross point of the word line will be set to the high resistance level. If a single pulse is not sufficient to change the resistivity of the bit region, multiple voltage pulses, at a level lower than the level at which the perovskite material would be damaged, can be used to affect the change. By repeating the process with the remaining word lines, the entire memory block can be set to the same state.

The bit 50 can be programmed by applying an on voltage to the bit pass gate 64, applying a second on voltage to the load gate 66, and applying at least one programming voltage pulse to the word line. The voltage pulse applied to the word line is the opposite polarity to the polarity used for the word, or block, erase, such that the resistivity of the bit resistor 52 is changed to the opposite resistivity state. If n-channel transistors are used as described above in one embodiment, the programming pulse will be positive and the resistance of the bit resistor 52 will preferably change from a high resistance state to a low resistance state.

The bit pass gate 64 of any unselected bits and the load transistor gate 66 of any unselected memory blocks 30 are connected to ground. Any voltage at the cross point of the word line and bit line will be very small, such that no significant change in resistance will occur at unselected bits.

As discussed above, the polarity and the voltage applied at the word line, the bit pass gate, and the load gate can be selected depending on whether n-channel or p-channel transistors are used to obtain the desired behavior of the memory circuit.

The bit can be read. A load voltage is applied to the load gate 66. The load voltage is smaller than the threshold voltage of the load transistor 36. In addition, at this load voltage the saturation current of the load transistor 36 is larger than the current flow through the bit resistor 52 when it is at a high resistance level. But, at this load voltage the saturation current of the load transistor 36 is lower than the current flow through the bit resistor 52 when it is at a low resistance level. The bit pass gate 64 is held at a voltage sufficient to allow current to flow through the bit pass transistor 34, for example $V_{cc}$. A readout voltage is applied to the word line. The voltage applied to the word line is preferably a pulse with a voltage lower than the critical voltage necessary to change the resistivity of the bit resistor 52.

If the bit resistor 52 is at a high resistance state, the current flow through the bit resistor 52 is smaller than the saturation current of the load transistor 36. The bit line voltage is then lower than the threshold voltage of an n-channel transistor at an input of the inverter 38. The output voltage of the inverter is then equal to approximately its power supply voltage.

If the bit resistor 52 is at a low resistance state a large current tends to flow through the bit resistor. This large current is larger than the saturation current of the load transistor. The bit line voltage is larger than the threshold voltage of an n-channel transistor at an input of the inverter 38. The output voltage of the inverter is then equal to approximately zero volts, which corresponds to ground.

Using the example discussed above, the current through the bit is expected to be between 6 nA and 100 nA. The bias voltage applied at the load gate of the load transistor should be selected so that the saturation current of the load transistor is between 6 nA and 100 nA, for example 50 nA. If the resistance of the bit is high enough that the current through it is less than 50 nA current will not flow through the load transistor and the output of the inverter will go to the operation voltage, for example Vcc. If the resistance of the bit is low, so that more than 50 nA flow through it, the current will flow through the load transistor and the output of the inverter will go to approximately 0 volts, or ground. If it is desired to have the bit at high resistance correspond to 0 volts, and the bit at low resistance correspond to the operation voltage, an additional inverter can be added at the output of the inverter.

Although a preferred embodiment, and other embodiments have been discussed above, the coverage is not limited to these specific embodiments. Rather, the claims shall determine the scope of the invention.

What is claimed is:

1. A memory structure comprising;
   a) a substrate;
   b) a plurality of bottom electrodes overlying the substrate;
   a) a plurality of top electrodes overlying the bottom electrodes, wherein the top electrodes cross over the bottom electrodes forming a cross point at each cross over location; and
   d) a single layer of colossal magnetoresistance (CMR) material interposed between the plurality of top electrodes and the plurality of bottom electrodes at each cross point.

2. The memory structure of claim 1, wherein the bottom electrodes comprise a bottom electrode material that allows for epitaxial formation of the single layer of colossal magnetoresistance (CMR) material overlying the bottom electrodes.

3. The memory structure of claim 2, wherein the bottom electrode material is YBCO.

4. The memory structure of claim 1, wherein the bottom electrode material is platinum.

5. The memory structure of claim 1, wherein the single layer of colossal magnetoresistance (CMR) material is $Pr_{0.7}Ca_{0.3}MnO_3$ (PCMO).

6. The memory structure of claim 1, wherein the single layer of colossal magnetoresistance (CMR) material is $Gd_{0.7}Ca_{0.3}BaCo_2O_{5+5}$.

7. A memory structure comprising;
   a) a silicon substrate;
   b) a plurality of platinum bottom electrodes overlying the substrate;
   c) a plurality of platinum top electrodes overlying the bottom electrodes, wherein the top electrodes cross over the bottom electrodes forming a cross point at each cross over location; and
   d) a single layer of $Pr_{0.7}Ca_{0.3}MnO_3$ (PCMO) interposed between the plurality of top electrodes and the plurality of bottom electrodes at each cross point.

8. A memory structure comprising;
   a) a silicon substrate;
   b) a plurality of platinum bottom electrodes overlying the substrate;
   c) a plurality of platinum top electrodes overlying the bottom electrodes, wherein the top electrodes cross over the bottom electrodes forming a cross point at each cross over location; and
   d) a single layer of $Gd_{0.7}Ca_{0.3}BaCo_2O_{5+5}$ interposed between the plurality of top electrodes and the plurality of bottom electrodes at each cross point.

* * * * *